(12) United States Patent
Freitag et al.

(10) Patent No.: US 8,068,315 B2
(45) Date of Patent: Nov. 29, 2011

(54) CURRENT PERPENDICULAR TO PLANE GMR AND TMR SENSORS WITH IMPROVED MAGNETIC PROPERTIES USING RU/SI SEED LAYERS

(75) Inventors: James Mac Freitag, Sunnyvale, CA (US); Hardayal Singh Gill, Palo Alto, CA (US); Mustafa Michael Pinarbasi, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 1098 days.

(21) Appl. No.: 11/862,119

(22) Filed: Sep. 26, 2007

(65) Prior Publication Data

US 2009/0080122 A1  Mar. 26, 2009

(51) Int. Cl.
*G11B 5/39* (2006.01)
(52) U.S. Cl. .................................................. 360/324.11
(58) Field of Classification Search .............. 360/324.11
See application file for complete search history.

(56) References Cited

U.S. PATENT DOCUMENTS

| | | | |
|---|---|---|---|
| 5,341,118 A | 8/1994 | Parkin et al. | 338/32 |
| 6,624,985 B1 | 9/2003 | Freitag et al. | 360/324.1 |
| 6,741,429 B1 | 5/2004 | Baglin et al. | 360/313 |
| 6,891,703 B2 * | 5/2005 | Hasegawa | 360/324.11 |
| 6,914,257 B2 | 7/2005 | Shimura et al. | 257/24 |
| 7,268,982 B2 * | 9/2007 | Gill | 360/324.11 |
| 7,333,302 B2 * | 2/2008 | Lee et al. | 360/324.1 |
| 7,333,306 B2 * | 2/2008 | Zhao et al. | 360/324.12 |
| 7,363,699 B2 * | 4/2008 | Carey et al. | 29/603.16 |
| 7,369,373 B2 * | 5/2008 | Gill | 360/324.12 |
| 7,408,749 B2 * | 8/2008 | Gill | 360/324.2 |
| 7,457,085 B2 * | 11/2008 | Carey et al. | 360/324.12 |
| 7,463,459 B2 * | 12/2008 | Ding et al. | 360/324.12 |
| 7,529,066 B2 * | 5/2009 | Carey et al. | 360/324.11 |
| 7,788,796 B2 * | 9/2010 | Hsiao et al. | 29/603.16 |
| 2003/0203189 A1 * | 10/2003 | Futamoto et al. | 428/332 |
| 2005/0168887 A1 | 8/2005 | Yuasa et al. | 360/324.12 |
| 2005/0243476 A1 | 11/2005 | Gill | 360/324.11 |
| 2006/0067017 A1 | 3/2006 | Yuasa et al. | 360/324.12 |
| 2006/0152863 A1 | 7/2006 | Freitag et al. | 360/324.12 |
| 2006/0164765 A1 | 7/2006 | Li et al. | 360/324.11 |
| 2006/0165881 A1 | 7/2006 | Li et al. | 427/131 |
| 2006/0168794 A1 * | 8/2006 | Contreras et al. | 29/603.01 |

FOREIGN PATENT DOCUMENTS

JP  2002289947  10/2002

(Continued)

OTHER PUBLICATIONS

Mun et al., "X-ray absorption spectroscopy studies on magnetic tunnel junctions with AlO and AlN tunnel barriers" Journal of Applied Physics 99, 2006.

(Continued)

*Primary Examiner* — Mark Blouin
(74) *Attorney, Agent, or Firm* — Zilka-Kotab, PC

(57) ABSTRACT

A magnetoresisive sensor having a thin seed layer that provides an exceptionally smooth interface between layers of the sensor stack. The exceptionally smooth interface provided by the seed layer reduces interlayer exchange coupling allowing the non-magnetic spacer layer (or barrier layer) to be very thin. The seed layer includes a thin layer of Ru and a thin layer of Si which intermix to form a homogeneous, amorphous thin seed layer of Ru-silicide.

21 Claims, 5 Drawing Sheets

FOREIGN PATENT DOCUMENTS

JP 2003031866 1/2003

OTHER PUBLICATIONS

Wang et al., "Structural characterization on base/collector interfaces for magnetic tunnel transistors grown on Si(001)" Journal of Applied Physics 97, 2005.

Parks et al., "Interfacial roughness effects on interlayer coupling in spin valves grown on different seed layers" Journal of Applied Physics vol. 87, No. 6, Mar. 15, 2000.

"IrMn Bottom Spin Valves With Improved Signal Using Si Underlayers" IP.COM Disclosure 000013487D, Jun. 18, 2003.

* cited by examiner

CURRENT PERPENDICULAR TO PLANE GMR AND TMR SENSORS WITH IMPROVED MAGNETIC PROPERTIES USING RU/SI SEED LAYERS

FIELD OF THE INVENTION

The present invention relates to magnetoresistive sensors and more particularly to a current perpendicular to plane sensor having a seed layer that improves interlayer smoothness and reduces interlayer exchange coupling.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

The need for ever increased data density is pushing researches to develop magnetic recording heads that can read ever smaller bits of data. With regard to magnetoresistive sensor, this means that the stack height of the sensor must be reduced. However, as the layers of the sensor become very small, certain challenges arise to sensor performance. For example, interlayer coupling makes it difficult to decrease the size of layers such as the spacer or barrier layer.

Therefore, there is a need for a sensor structure or method of manufacture thereof that can produce a sensor having a very small stack height while also having exceptional, uncompromised performance.

SUMMARY OF THE INVENTION

The present invention provides a magnetoresistive sensor having a seed layer that includes Si and Ru. The seed layer produces an extremely smooth interface in the layers deposited thereover.

The resulting smooth interfaces between the non-magnetic spacer layer (or barrier layer) and the adjacent free and pinned layer greatly reduces interlayer coupling fields between these layers. This allows the spacer or barrier layer to be constructed very thin while avoiding instability problems that would otherwise be associated with the use of a thin spacer or barrier layer.

The seed layer can be deposited by depositing a layer of Ru and a layer of Si, each having a thickness of only 2-3 Angstroms. At these small thicknesses the Ru and Si intermix forming a homogeneous, amorphous seed layer of Ru-silicide. This homogeneous nature of the seed layer reduces parasitic resistance by reducing the number of interface layers. In addition, the very small thickness of the seed layer allows the size of the sensor stack to be even further reduced, thereby advantageously increasing data density.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode Of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
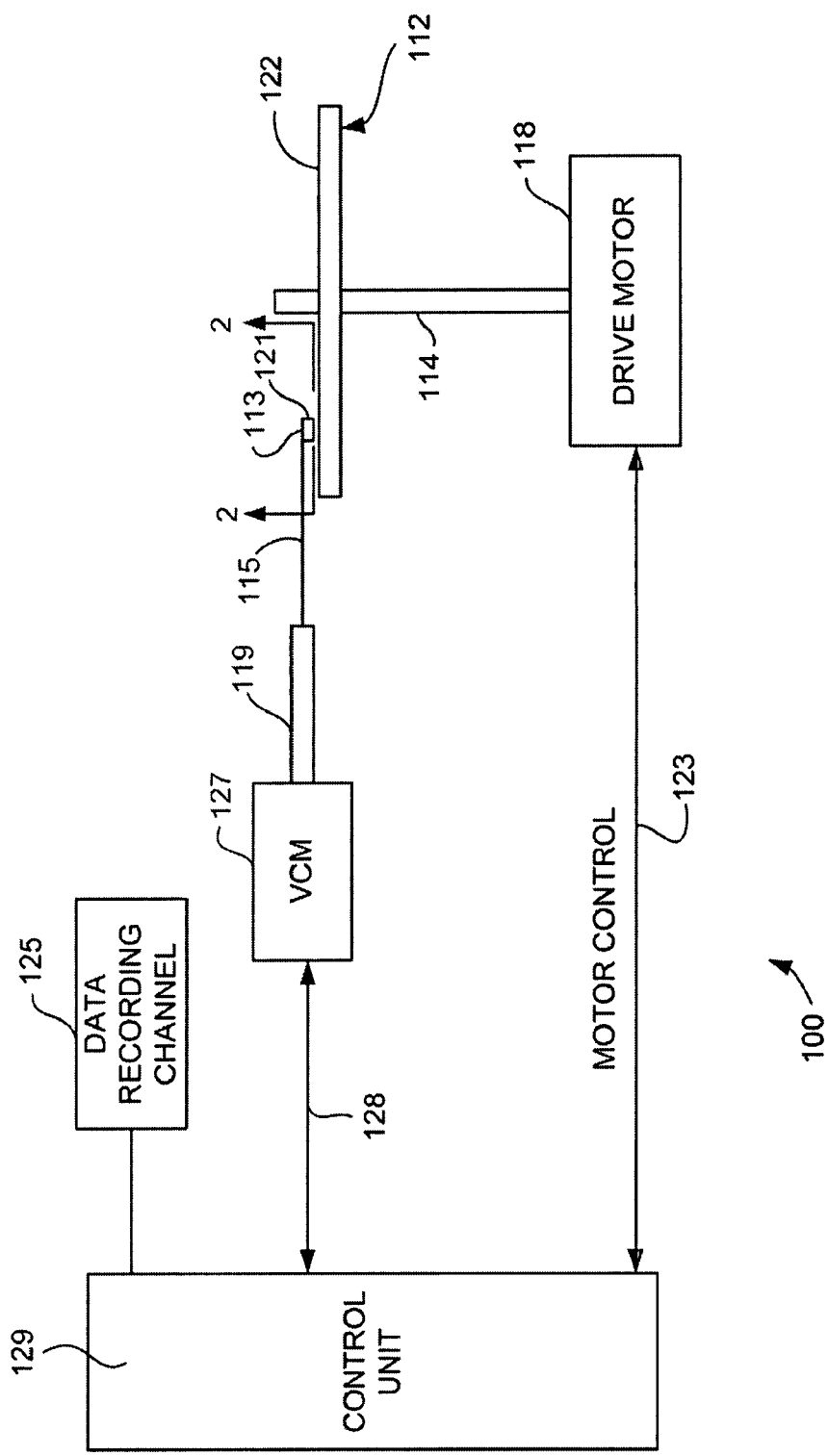
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
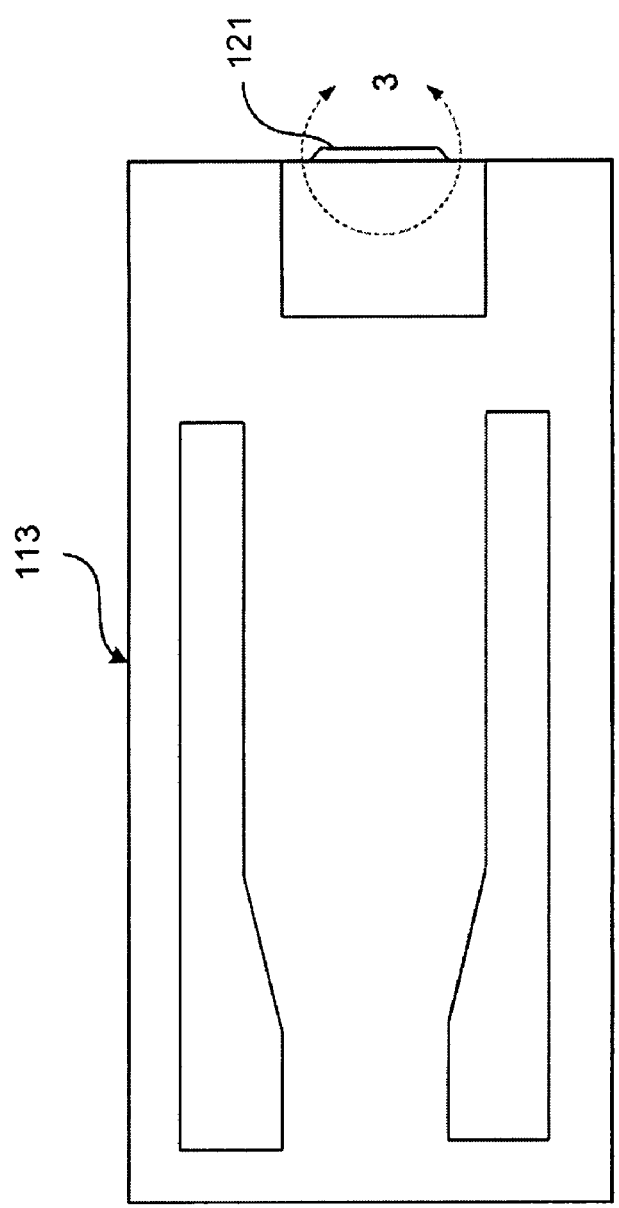
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
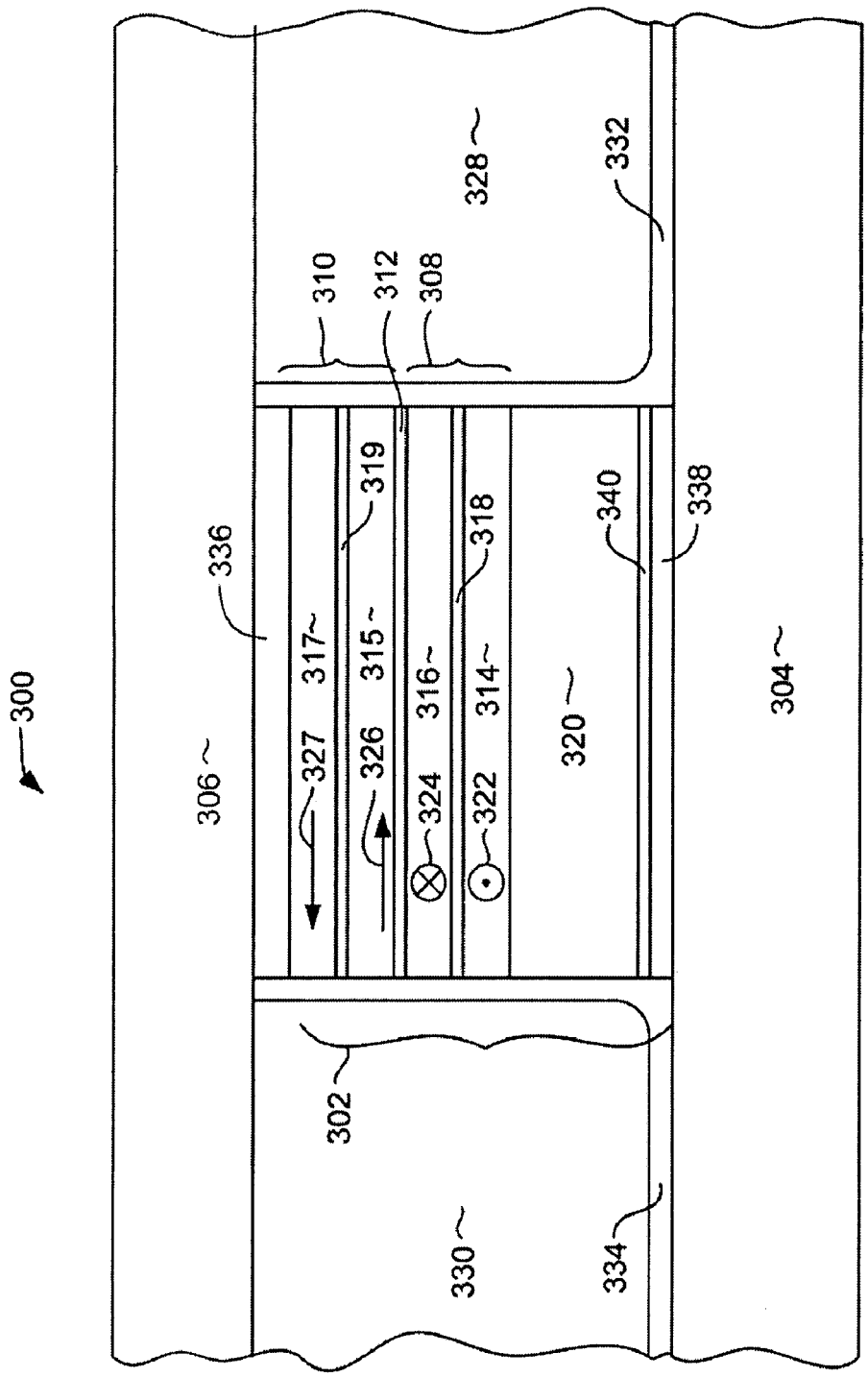
FIG. 3 is an enlarged ABS view taken from circle 3 of FIG. 2 rotated 90 degrees counterclockwise.

With reference now to FIG. 3, a magnetoresistive sensor 300 can be seen as viewed from the Air Bearing Surface (ABS). Although the sensor 300 is described herein as being a current perpendicular to plane (CPP) sensor, it could also be embodied in a Current In Plane (CIP) sensor. With this in mind, the sensor 300 includes a sensor slack 302 sandwiched between first and second electrically conductive (preferably magnetic) leads 304, 306, which can be constructed of, for example, NiFe.

The sensor stack 302 includes a pinned layer structure 308, and a free layer structure 310. A spacer layer 312 such as Cu or Cu-O is sandwiched between the pinned and free layer structures 308, 310. It should be pointed out that the invention can be embodied in a GMR sensor or a tunnel valve sensor. If the invention is embodied in a tunnel valve sensor, the layer 312 will be a thin, electrically insulating barrier layer, constructed of, for example MgO or some other suitable material. Because of an advantageous effect of a thin novel seed layer (to be described below), the spacer layer 312 (or barrier layer) can be constructed very thin. Therefore, the layer 312 preferably has a thickness of 17 to 30 Angstroms.

The pinned layer structure 308 includes first and second magnetic layers 314, 316, which are antiparallel coupled across a non-magnetic AP coupling layer 318 sandwiched therebetween. The magnetic layer 314 can be constructed of, for example, CoFe and the AP coupling layer 318 can be constructed of, for example, Ru having a thickness of about 4 Angstroms. The magnetic layer 316 (closest to the spacer layer 312) is preferably constructed of a Heusler alloy. Such a Heusler alloy could be for example, $Co_2XY$, where X is Mn, Fe or Cr and Y is Si, Ge or Al. Such an alloy could contain about 50 atomic percent Co about 25 atomic percent X and about 25 atomic percent Y.

One of the magnetic layers 314 is exchange coupled with a layer of antiferromagnetic material (AFM layer) 320. The AFM layer 320 can be constructed of a material such as PtMn or IrMn, and is preferably constructed of IrMn. This exchange coupling with the AFM layer 320 strongly pins a magnetization of the first magnetic layer 314 in a first direction perpendicular to the ABS as indicated by arrowhead 322. Antiparallel coupling between the layers 314, 316 pins the magnetization of the second magnetic layer 316 in a second direction that is antiparallel with first direction as in indicated by arrow tail 324.

The free layer 310 can be constructed of one or more layers of magnetic material but is preferably an AP coupled, synthetic, free layer structure. As such, the free layer 310 preferably includes first and second magnetic layers 315, 317 that are antiparallel coupled across a non-magnetic coupling layer 319 such as Ru. The layer 317 can include one or more layers of Co, NiCo or NiFe. The layer 315 (closest to the spacer layer 312) is preferably constructed of a Heusler alloy (similar to layer 316 of the pinned layer structure 308 described above). To this end, the layer 315 can be constructed of for example, $Co_2XY$, where X is Mn, Fe or Cr and Y is Si, Ge or Al. Such an alloy could contain about 50 atomic percent Co about 25 atomic percent X and about 25 atomic percent Y.

As mentioned above, the invention can be embodied in a tunnel junction magnetoresistive sensor (TMR). If the sensor is a TMR sensor, the layer 316 is preferably constructed of an amorphous layer of CoFeB, and layer 315 of the free layer 310 preferably includes a layer of CoFeB, being constructed, for example as a layer of CoFe and a layer of CoFeB. The amorphous structure of the layer 316 is desired to promote a crystalline structure in the MgO barrier layer 312.

The magnetic layers 315, 317 of the free layer structure 310 have magnetizations 326, 327 that are biased in a direction parallel with the ABS as indicated by arrows 326 and 327. While the magnetizations 326, 327 are biased parallel to the ABS they are not pinned and are able to move in response to a magnetic field such as from a magnetic medium (not shown in FIG. 3). The biasing of the magnetizations 326, 327 of the free layer 310 can be maintained by a magnetic bias field from first and second hard magnetic bias layers 328, 330, formed at each side of the sensor stack 302. The hard bias layers 328, 330 can be constructed of a hard magnetic material such as CoPt or CoPtCr. First and second insulation layers 332, 334 separate the hard bias layers 328, 330 from the sensor stack 302 and from at least one of the leads 304 in order to prevent sense current from being shunted across the leads 304, 306. The insulation layers can be constructed of, for example, conformally deposited alumina.

A capping layer 336, constructed of, for example Ta can be provided at the top of the sensor stack 302 in order to prevent corrosion or other damage to the sensor stack 302 during manufacture. In addition, a Ta under-layer 338 may be provided at the bottom of the sensor stack 302 to ensure optimal electrical conductivity with the lead layer 304.

Novel Seed Layer:

With continued reference to FIG. 3, a seed layer 340 is provided at the bottom of the sensor stack directly beneath the AFM layer 320. As discussed above, in current and future magnetoresistive sensors it is desirable to minimize the stack height of the sensor in order to reduce bit length as much as possible, and thereby increase data density. For CPP-GMR sensors, one layer that can be substantially reduced with no penalty to signal is the Cu spacer layer 312. However, ferromagnetic Néel coupling, due to the roughness of the interfaces between the spacer layer 312 and magnetic layers 316, 310, creates a large inter-layer coupling field that can interfere with the biasing of the magnetization 326 of the free layer 310 resulting in an unstable, poor performing sensor. Furthermore, with certain half-metal Heusler alloys in both the reference and free layers, which have been shown to improve magnetoresistance, the coupling field can increase considerably. Likewise, TMR sensors suffer the same high interlayer coupling fields since they employ very thin barrier layers. It is therefore, highly desirable to reduce the roughness of the interfaces and mitigate these inter-layer coupling field.

To this end, the seed layer 340 provides an extremely smooth surface for the epitaxial growth of the subsequently deposited layers 320, 314, 318, 316, 312, 310. In fact, the presence of this novel, and extremely thin seed layer 340 results in such a smooth interface between the spacer (or barrier) layer 312 and adjacent magnetic layers 316, 310, that coupling fields at these interfaces are virtually eliminated.

Figure 5:
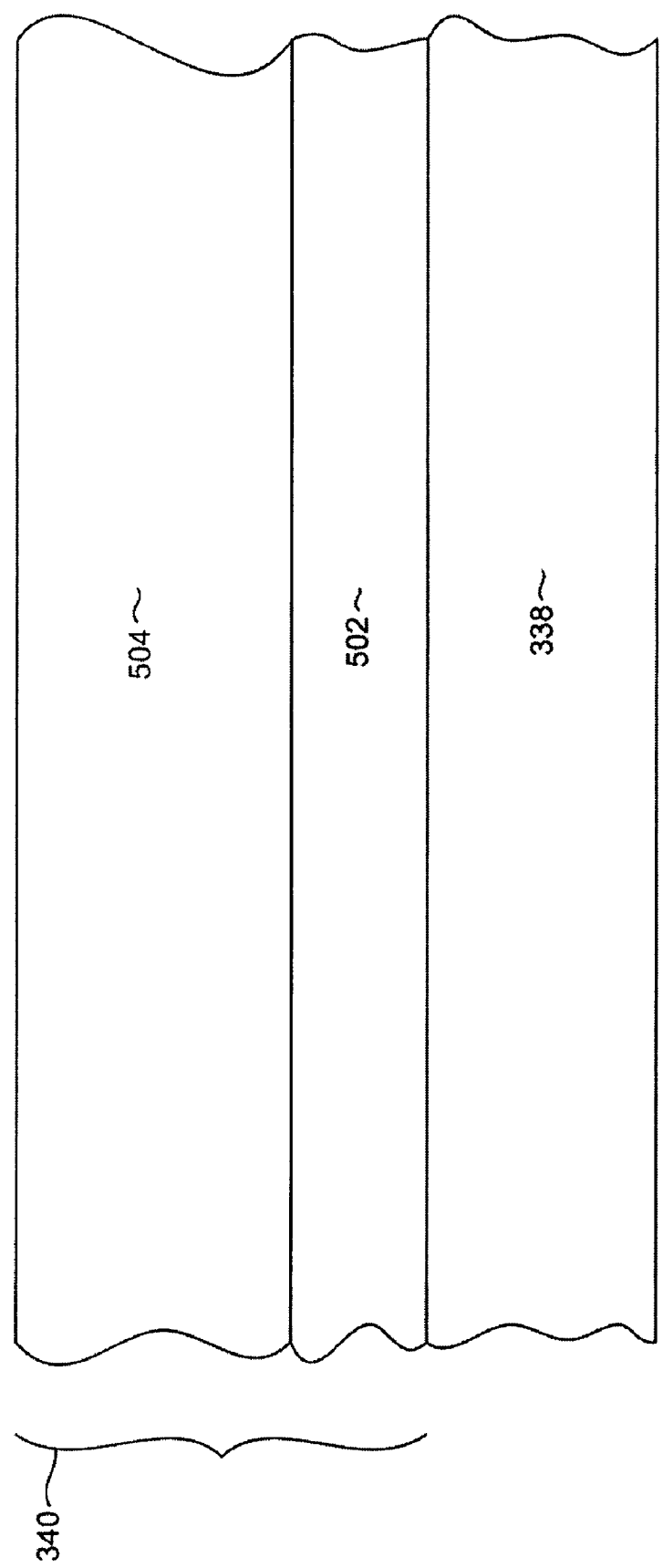
FIG. 5 is an ABS view of a seed layer structure according to an embodiment of the invention.

With reference to FIG. 5, the seed layer 340 includes a very thin layer of amorphous Ru-silicide 502, and a relatively thicker layer of Ru 504 formed thereover. The layer 502 can be formed by depositing individual layers of Ru and Si, each having a thickness of 2-3 Angstroms. This extremely thin size of the seed layer 340 promotes the goal of having as thin a stack height as possible, in order to meet the data density requirements of current and future recording heads. In addition, Ru and Si tend to intermix. At these very small layer thicknesses (e.g. 2-3 Angstroms each) the layers completely intermix so that the individually deposited Si and Ru layers become a homogeneous, amorphous Ru-silicide layer. In a homogeneous layer, the number of distinct interfaces is minimized. Since electrons tend to scatter at interfaces, each new interface is a potential source of parasitic resistance which reduces sensor signal. It is therefore, preferable to minimize the number of interfaces in the seed layer. Additionally, the amorphous structure of the layer 502 has two important functions. First, it promotes the smooth growth of the IrMn AFM layer, which grows directly on top of the layer 504 of the seed layer 340, and thereby reduces the interlayer coupling field caused by the Néel coupling between the pinned and free layers. This is especially important for spin valve structures incorporating Heusler alloys in pinned and free layers as these materials tend to increase the roughness and, consequently, the inter-layer coupling. Second, the amorphous seed layer can also increase the grain size in the sensor stack leading to higher dR/R and improved sensor signal. While the amorphous Ru-silicide layer 502 advantageously results in smooth interfaces in the above deposited layers, the Ru layer 504 promotes strong pinning of the pinned layer structure 308 (FIG. 3), deposited over the seed layer 340. The Ru layer 504 can have a thickness of 10-15 Angstroms.

The Ru/Si (or Ru-silicide) seed layer 340 described above substantially improves the interlayer coupling field compared with a standard Ru seed layer. For example, using a 22 Angstrom thick Cu spacer layer 312, and the seed layer 340 described above results in a 27 Oerstead reduction in the coupling field. It has also been noted that the free layer coercivity (i.e. the coercivity of the free layer with near zero coupling field) is not adversely affected by the improved seed layer 340.

Figure 4:
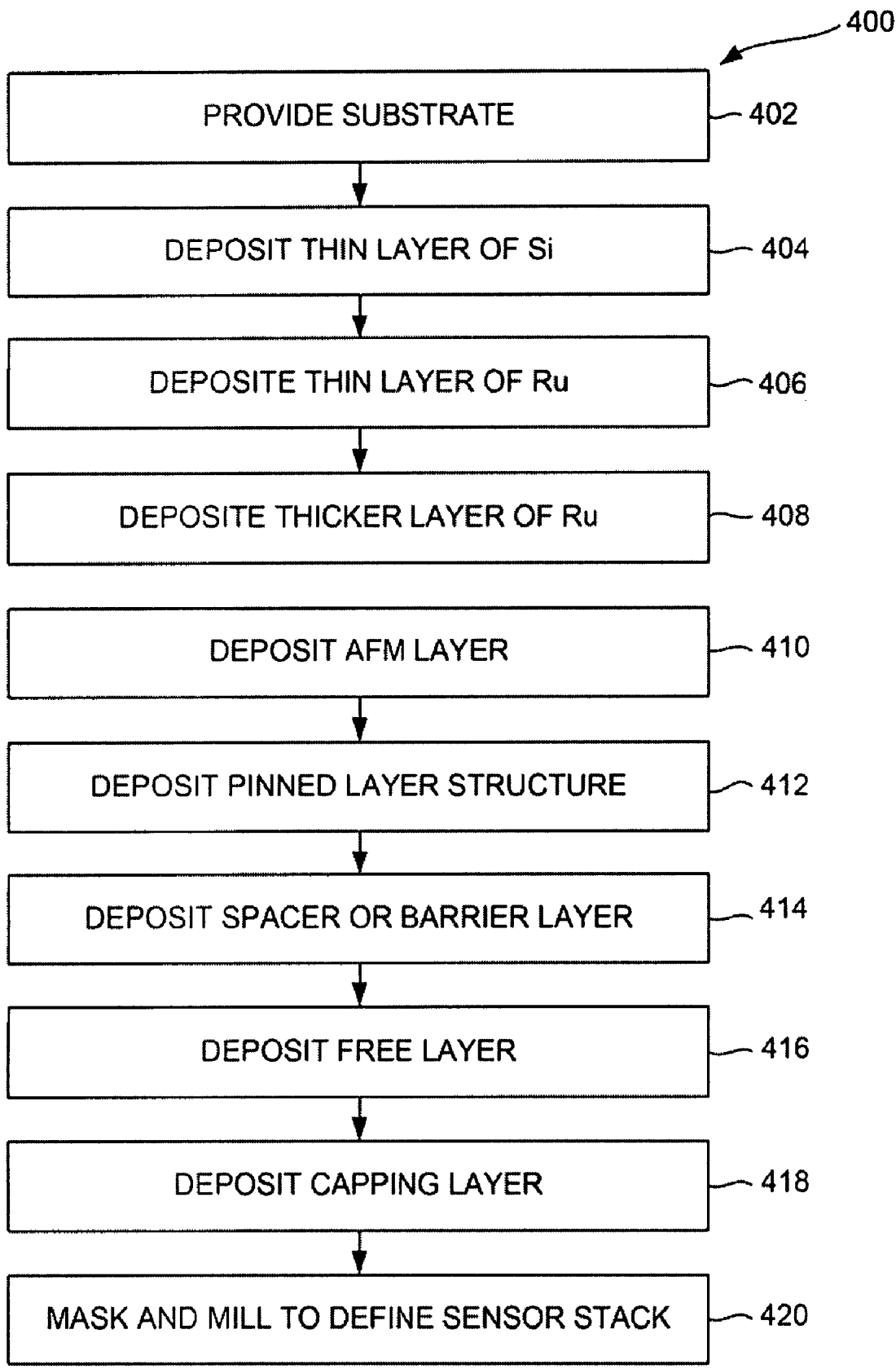
FIG. 4 is a flow chart illustrating a method for manufacturing a magnetoresistive sensor according to an embodiment of the invention.

With reference now to FIG. 4, a method 400 for manufacturing a magnetoresistive head according to an embodiment of the invention is summarized. First, in a step 402, a substrate is provided. This substrate can include an electrically conductive, magnetic lead or could include an electrically insulating gap layer (in the case of a current in plane sensor). A Ta under layer can optionally be deposited over the substrate. Then, in a step 404, a thin layer of Si is deposited to provide a first portion of a seed layer structure. The seed layer can be deposited by sputter deposition to a thickness of 2-3 Angstroms. Then, in a step 406 a thin layer of Ru is deposited to provide a second portion of the seed layer structure. The layer or Ru can be deposited to a thickness of 2-3 Angstroms. The order of deposition of the Si and Ru layers can be reversed so that the Ru layer is deposited prior to deposition of the Si layer. As discussed above, at these very small thicknesses (i.e. 2-3 Angstroms) the Si and Ru layers intermix to form a homogeneous, amorphous Ru-silicide layer. Then, in a step 408 a relatively thicker layer of Ru is deposited over the thin layers deposited above (over the resulting Ru-silicide layer). This thicker layer of Ru can be deposited to a thickness of 10 to 15 Angstroms.

Then, in a step 410 a layer of antiferromagnetic material (preferably IrMn) is deposited. Then, in a step 412 a pinned layer structure is deposited. The deposition of the pinned layer structure can include depositing a first CoFe layer depositing a Ru AP coupling layer and depositing a second CoFe layer. In a step 414 a spacer layer or barrier layer is deposited. As discussed above, the presence of the seed layer deposited in steps 404-408 allows the spacer or barrier layer to be deposited very thin without experiencing disadvantageous levels of interlayer coupling. Therefore, the spacer or barrier layer can be deposited to a thickness of 17 to 30 Angstroms. Then, in a step 416 the free magnetic layer can be deposited, followed by an optional capping layer of Ta in a step 418.

In a step 420, a masking and milling process can be performed to define a sensor. This step can include forming a first mask structure to define the back edge or stripe height of the sensor, then performing a first ion milling to remove portions of the deposited layers that are not protected by the first mask. Then, a second mask is formed, configured to define the sides of the sensor. A second milling is then performed to remove portions of the deposited layers that are not protected by the second mask structure. After the sensor has been defined, an insulating material can be deposited to form the insulation layers 332, 334 described above with reference to FIG. 3. A hard magnetic material can be deposited to form the bias layers 328, 330, and the second mask can be removed. An electrically conductive, magnetic material can then be deposited to form the second lead 306.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor, comprising:
a magnetic pinned layer structure;
a magnetic free layer structure;
a non-magnetic layer sandwiched between the free layer and the pinned layer;
a layer of antiferromagnetic material exchange coupled with a layer of the pinned layer structure; and
a seed layer adjacent to the layer of antiferromagnetic material, the seed layer comprising Si and Ru that have intermixed to form an amorphous Ru-silicide.

2. A sensor as in claim 1 wherein the seed layer has a thickness of 4-6 Angstroms.

3. A sensor as in claim 1 wherein the seed layer comprises a, amorphous layer.

4. A sensor as in claim 1 wherein the seed layer comprises a layer of Ru having a thickness of 2-3 Angstroms and a layer of Si having a thickness of 2-3 Angstroms, and wherein the layers of Ru and Si have intermixed.

5. A sensor as in claim 1 wherein the non-magnetic layer comprises an electrically conductive layer having a thickness of 17 to 30 Angstroms.

6. A sensor as in claim 1 wherein the non-magnetic layer comprises a layer of Cu having a thickness of 17 to 30 Angstroms.

7. A sensor as in claim 1 wherein the non-magnetic layer comprises a layer of Cu—O having a thickness of 17 to 30 Angstroms.

8. A sensor as in claim 1 wherein the non-magnetic layer comprises an electrically insulating barrier layer.

9. A sensor as in claim 1 wherein the non-magnetic layer comprises an electrically insulating barrier layer having a thickness of 17-30 Angstroms.

10. A sensor as in claim 1 wherein the sensor is a current perpendicular to plane magnetoresistive sensor.

11. A sensor as in claim 1 wherein the layer of antiferromagnetic material comprises IrMn.

12. A sensor as in claim 1 wherein the seed layer comprises a layer of Ru-silicide and a layer of Ru.

13. A sensor as in claim 1 wherein the seed layer comprises a layer of Ru-silicide having a thickness of 4-6 Angstroms and a layer of Ru having a thickness of 10-15 Angstroms.

14. A method for manufacturing a magnetoresistive sensor, comprising:
providing a substrate;
depositing a layer of Ru;
depositing a layer of Si over the layer of Ru the Ru and Si being deposited sufficiently thick that they intermix to form an amorphous Ru-silicide; and
depositing a sensor stack over the layers of Ru and Si.

15. A method as in claim 14 wherein the depositing a sensor stack further comprises:
depositing a layer of antiferromagnetic material over the layer of Si;
depositing a pinned layer structure over the layer of antiferromagnetic material;
depositing a non-magnetic layer over the pinned layer structure; and
depositing a magnetic free layer over the non-magnetic layer.

16. A method as in claim 15 wherein the non-magnetic layer is deposited to a thickness of 17-30 Angstroms.

17. A method as in claim 14 wherein the layer of Ru and the layer of Si are each deposited to a thickness of 2-3 Angstroms.

18. A method for manufacturing a magnetoresistive sensor, comprising:
providing a substrate;
depositing a layer of Si over the substrate;
depositing a layer of Ru over the layer of Si the layers of Si and Ru being deposited sufficiently thin that they intermix to form an amorphous Ru-silicide; and
depositing a sensor stack over the layer of Ru and Si.

19. A method as in claim 18 wherein the layer of Si and the layer of Ru each have a thickness of 2 to 3 Angstroms.

20. A method for manufacturing a magnetoresistive sensor, comprising:
providing a substrate;
depositing Ru and Si over the substrate the Ru and Si being deposited sufficiently thin that they intermix to form an amorphous Ru-silicide;
depositing a layer of Ru over the Ru-silicide; and
depositing a sensor stack over the layer of Ru.

21. A method as in claim 20 wherein the layer of Ru deposited over the Ru-silicide has a thickness of 10-15 Angstroms.

* * * * *

UNITED STATES PATENT AND TRADEMARK OFFICE
CERTIFICATE OF CORRECTION

| | | |
|---|---|---|
| PATENT NO. | : 8,068,315 B2 | Page 1 of 1 |
| APPLICATION NO. | : 11/862119 | |
| DATED | : November 29, 2011 | |
| INVENTOR(S) | : James Mac Freitag et al. | |

It is certified that error appears in the above-identified patent and that said Letters Patent is hereby corrected as shown below:

In the Specification:

Column 2, line 53 replace "mode Of use" with --mode of use--;

Column 3, line 67 replace "sensor slack" with --sensor stack--.

Signed and Sealed this
Seventh Day of July, 2015

Michelle K. Lee
*Director of the United States Patent and Trademark Office*